(12) United States Patent
Lam et al.

(10) Patent No.: US 9,343,545 B2
(45) Date of Patent: May 17, 2016

(54) ELECTRICAL COUPLING OF MEMORY CELL ACCESS DEVICES TO A WORD LINE

(71) Applicant: International Business Machines Corporation, Armonk, NY (US)

(72) Inventors: Chung H. Lam, Peekskill, NY (US); Jing Li, Ossining, NY (US); Edward W. Kiewra, North Creek, NY (US)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 13/786,573

(22) Filed: Mar. 6, 2013

(65) Prior Publication Data

US 2014/0252418 A1   Sep. 11, 2014

(51) Int. Cl.
| | |
|---|---|
| H01L 27/118 | (2006.01) |
| H01L 29/66 | (2006.01) |
| H01L 27/22 | (2006.01) |
| H01L 27/24 | (2006.01) |
| G11C 13/00 | (2006.01) |

(52) U.S. Cl.
CPC ........ *H01L 29/66666* (2013.01); *H01L 27/228* (2013.01); *H01L 27/2454* (2013.01); *H01L 27/2463* (2013.01); *G11C 13/003* (2013.01); *G11C 2213/79* (2013.01)

(58) Field of Classification Search
CPC .......................... H01L 21/8239; H01L 27/1052
USPC ....................................................... 257/202
See application file for complete search history.

(56) References Cited

U.S. PATENT DOCUMENTS

| 6,156,611 A | 12/2000 | Lan et al. ...................... 438/268 |
| 7,382,647 B1 | 6/2008 | Gopalakrishnan ............ 365/163 |
| 2010/0295110 A1* | 11/2010 | Takaishi ........................ 257/300 |

OTHER PUBLICATIONS

Burr et al., Phase change memory technology, Journal of Vacuum Science and Technology B, vol. 28, issue 2, pp. 223-262 (2010).

\* cited by examiner

*Primary Examiner* — Phat X Cao
*Assistant Examiner* — Mohammad M Hoque
(74) *Attorney, Agent, or Firm* — Ido Tuchman; Vazken Alexanian

(57) ABSTRACT

A memory array and a method for electrically coupling memory cell access devices to a word line. The memory array includes a source line electrically coupled to each source terminal of the memory cell access devices. The memory array also includes a first set of at least two vertical pillars positioned above and electrically coupled to the source line. A second set of vertical pillars electrically isolated from the source line and positioned such that the source line does not extend below the second set of vertical pillars is also included. Furthermore, gate terminals of the memory cell access devices laterally surround the first set of vertical pillars and the second set of vertical pillars. Finally, a first word line contact is positioned between two of the second set of vertical pillars. The first word line contact is electrically coupled to the gate terminals.

8 Claims, 5 Drawing Sheets

ELECTRICAL COUPLING OF MEMORY CELL ACCESS DEVICES TO A WORD LINE

BACKGROUND

The present invention is directed toward memory arrays, and more particularly to a memory array and a method for electrically coupling memory cell access devices to a word line.

Three-dimensional (3D) memory arrays with several stacking layers provide very high memory densities. These 3D memory architectures call for selector devices which can be fully integrated in a back end of line (BEOL) process. In general, during the BEOL process the word line must be electrically coupled to the memory cell access devices of the memory array. The BEOL process may have a low thermal budget. Furthermore, two terminal selector devices typically have been integrated in a BEOL process. These two terminal diode-type devices have poor current controllability.

SUMMARY

Accordingly, one example aspect of the present invention is a memory array for electrically coupling memory cell access devices to a word line. The memory array includes a source line electrically coupled to each source terminal of the memory cell access devices. The memory array also includes a first set of at least two vertical pillars positioned above and electrically coupled to the source line. A second set of vertical pillars electrically isolated from the source line and positioned such that the source line does not extend below the second set of vertical pillars is also included. Furthermore, gate terminals of the memory cell access devices laterally surround the first set of vertical pillars and the second set of vertical pillars. Finally, a first word line contact is positioned between two of the second set of vertical pillars. The first word line contact is electrically coupled to the gate terminals.

Another example embodiment of the present invention is a method for electrically coupling memory cell access devices to a word line. The method includes a source line forming step for forming a source line for the access devices. A first vertical pillar forming step forms a first set of at least two vertical pillars above and electrically coupled to the source line. A second vertical pillar forming step forms a second set of vertical pillars that are electrically isolated from the source line and positioned such that the source line does not extend below the second set of vertical pillars. The method also includes a gate terminals forming step for forming a plurality of gate terminals laterally surrounding the first set of vertical pillars and the second set of vertical pillars. A word line contact forming step deposits a first word line contact between two of the second set of vertical pillars. The first word line contact is electrically coupled to the gate terminals.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
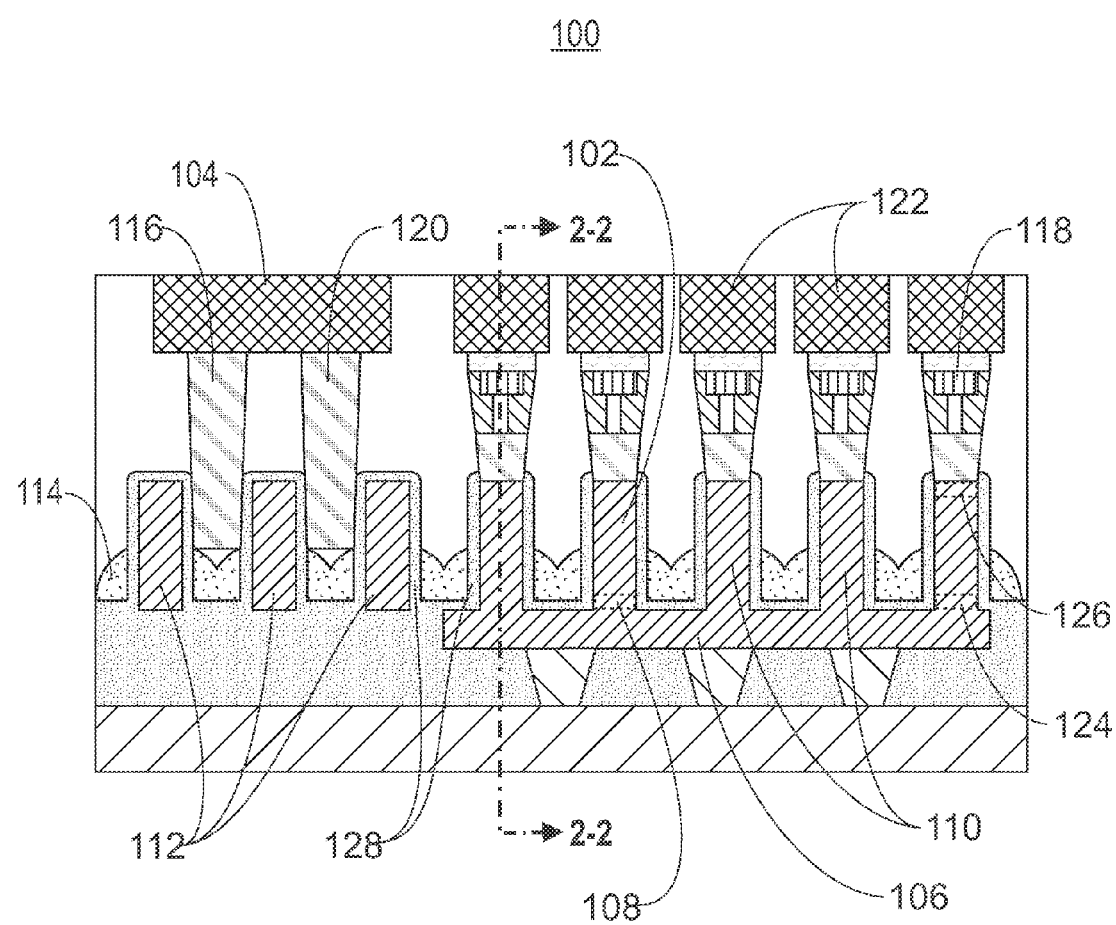
FIG. 1 shows a memory array for electrically coupling memory cell access devices to a word line in accordance with one embodiment of the present invention.

The present invention is described with reference to embodiments of the invention. Throughout the description of the invention reference is made to FIGS. 1-5. When referring to the figures, like structures and elements shown throughout are indicated with like reference numerals.

Figure 2:
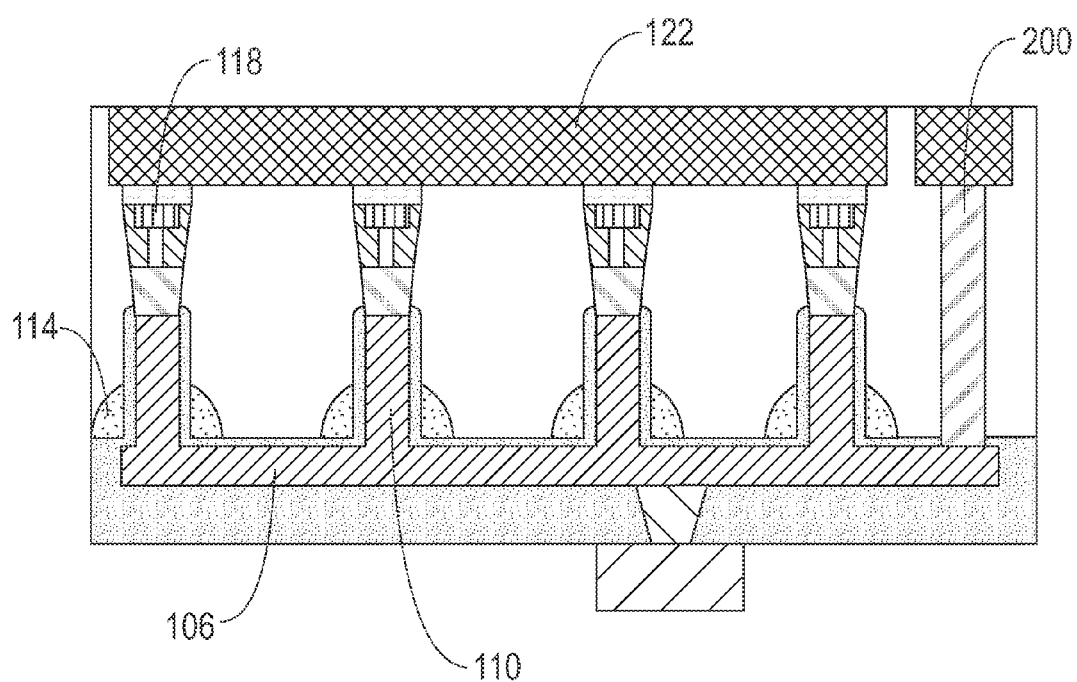
FIG. 2 shows the memory array of FIG. 1 along cross-sectional line 2-2.

FIG. 1 shows a memory array 100 for electrically coupling memory cell access devices 102 to a word line 104 in accordance with one embodiment of the present invention. FIG. 2 shows the memory array of FIG. 1 along cross-sectional line 2-2.

The memory array 100 includes a source line 106 electrically coupled to each source terminal 108 of the memory cell access devices 102 and a first set of at least two vertical pillars 110 positioned above the source line 106. Each of the first set of vertical pillars 110 includes a first end 124 and a second end 126. The first end 124 is electrically coupled to the source line 106.

The memory array 100 further includes a second set of vertical pillars 112 electrically isolated from the source line 106 and positioned such that the source line 106 does not extend below the second set of vertical pillars 112.

The memory array 100 further includes gate terminals 114 of the memory cell access devices 102. The gate terminals 114 laterally surround the first set of vertical pillars 110 and the second set of vertical pillars 112.

The memory array 100 further includes an oxide layer 128 surrounding the first set of vertical pillars 110 and the second set of vertical pillars 112. The oxide layer 128 is positioned between the first set of vertical pillars 110 and the gate terminals 114 and the second set of vertical pillars 112 and the gate terminals 114.

The memory array 100 further includes a first word line contact 116 positioned between two of the second set of vertical pillars 112. The first word line contact 116 is electrically coupled to the gate terminals 114. In one embodiment, the memory array 100 may include a second word line contact 120 positioned between two of the second set of vertical pillars 112 and electrically coupled to the gate terminals 114. In one embodiment, the memory array 100 may include a source line contact 200 electrically coupled to the source line 106.

The memory array 100 further includes a plurality of memory elements 118. Each memory element 118 is electrically coupled to the second end 126 of one of the first set of vertical pillars 110. A plurality of bit line contacts 122 are electrically coupled to the memory elements 118. The memory elements 118 may be, for example, resistive RAM (RRAM), magnetoresistive RAM (MRAM), spin-transfer torque RAM (STT-RAM), or phase-change memory (PCM).

Figure 3:
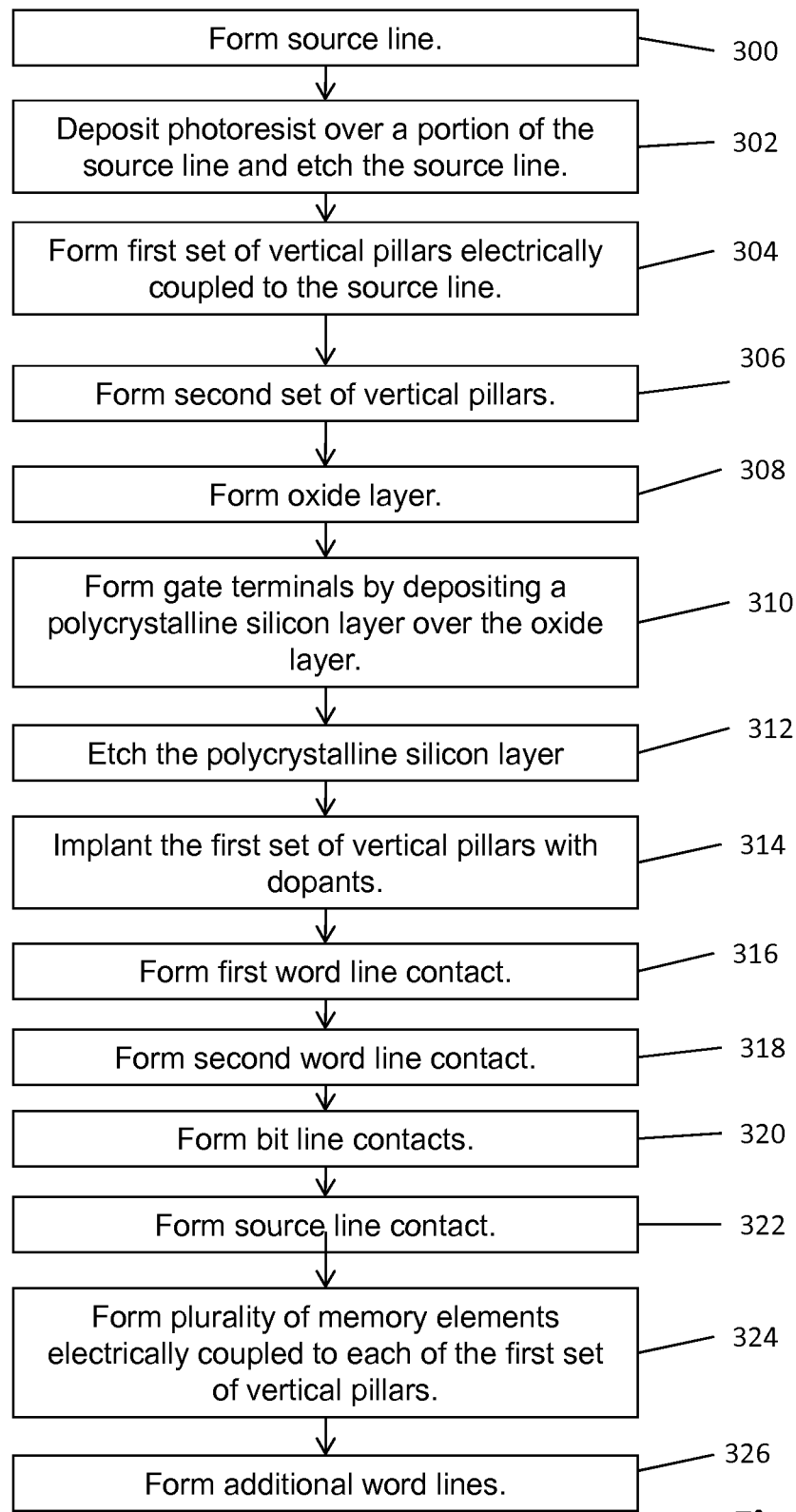
FIG. 3 shows a method for electrically coupling memory cell access devices to a word line in accordance with one embodiment of the present invention.

FIG. 3 shows a method for electrically coupling memory cell access devices to a word line in accordance with one embodiment of the present invention. The method includes a source line forming step 300. During the source line forming step 300 a source line for the access devices is formed. In one embodiment, the source line forming step 300 includes etching step 302. At etching step 302 the source line is formed by depositing a photoresist over a portion of the source line and then etching the portion of the source line that is not covered by the photoresist such that the source line does not extend beneath a region to be occupied by the electrically isolated second set of vertical pillars. After etching step 302 is completed, the method continues to first vertical pillar forming step 304.

At first vertical pillar forming step 304, a first set of at least two vertical pillars are formed above the source line. Each of the first set of vertical pillars includes a first end and a second end. The first end of each of the first set of vertical pillars is electrically coupled to the source line. A more detailed discussion of forming the first set of vertical pillars is presented below with reference to FIG. 4. After first vertical pillar forming step 304 is completed, the method continues to second vertical pillar forming step 306.

At second vertical pillar forming step 306, a second set of vertical pillars are formed. The second set of vertical pillars are electrically isolated from the source line and positioned such that the source line does not extend below the second set of vertical pillars. In some embodiments the second set of vertical pillars are formed concurrently with the first set of vertical pillars. A more detailed discussion of forming the second set of vertical pillars is presented below with reference to FIG. 4. After second vertical pillar forming step 306 is completed, the method continues to oxide layer forming step 308.

At oxide layer forming step 308, an oxide layer is formed such that the oxide layer surrounds the first set of vertical pillars and the second set of vertical pillars. Furthermore, the oxide layer is positioned between the first set of vertical pillars and the gate terminals and the second set of vertical pillars and the gate terminals. After oxide layer forming step 308 is completed, the method continues to gate terminals forming step 310.

At gate terminals forming step 310, a plurality of gate terminals laterally surrounding the first set of vertical pillars and the second set of vertical pillars are formed. In one embodiment, the gate terminals are formed by depositing a polycrystalline silicon layer over the oxide layer surrounding the first set of vertical pillars and the second set of vertical pillars and then, at etching step 312, etching the polycrystalline silicon layer such that the gate terminals are electrically coupled along the word line direction. After etching step 312 is completed, the method continues to dopant implanting step 314.

At dopant implanting step 314, the first set of vertical pillars are implanted with dopants to form source, channel, and drain regions. After dopant implanting step 308 is completed, the method continues to word line contact forming step 316.

At word line contact forming step 316, a first word line contact is formed between two of the second set of vertical pillars. The first word line contact is electrically coupled to the gate terminals. In one embodiment, another word line contact forming step 318 forms a second word line contact between two of the second set of vertical pillars. The second word line contact is also electrically coupled to the gate terminals. After word line contact forming step 318 is completed, the method continues to bit line contacts forming step 320.

At bit line contacts forming step 320, a plurality of bit line contacts are formed. Each bit line contact is electrically coupled to one of the first set of vertical pillars. After bit line contacts forming step 320 is completed, the method continues to source line contact forming step 322.

At source line contact forming step 322, a source line contact is formed. The source line contact is electrically coupled to the source line. After source line contact forming step 322 is completed, the method continues to memory element forming step 324.

At memory element forming step 324, a plurality of memory elements are formed. The memory elements are deposited and electrically coupled to the second end of each of the first set of vertical pillars. Furthermore, the memory elements are electrically coupled to one of the bit line contacts. The memory elements 118 may be, for example, resistive RAM (RRAM), magnetoresistive RAM (MRAM), spin-transfer torque RAM (STT-RAM), or phase-change memory (PCM). In one embodiment of the invention, memory element forming step 324 is followed by additional word lines forming step 326.

At additional word lines forming step 326 several vertical pillars are formed along different planes that are electrically isolated from each other. A more detailed discussion of forming vertical pillars along different planes is provided below with reference to FIG. 5.

Figure 4:
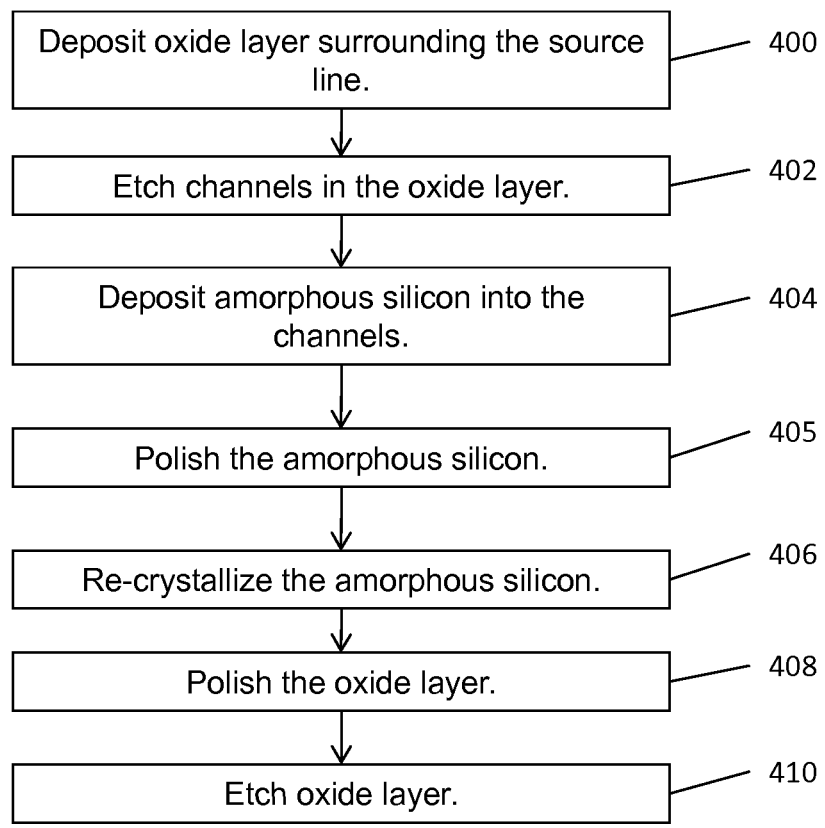
FIG. 4 shows a method for forming the first set of vertical pillars and the second set of vertical pillars in accordance with one embodiment of the present invention.

FIG. 4 shows a method for forming the first set of vertical pillars and the second set of vertical pillars in accordance with one embodiment of the present invention. The method includes an oxide layer deposit step 400. During the oxide layer deposit step 400 an oxide layer is deposited over and surrounding the source line. After oxide layer deposit step 400 is completed, the method continues to etching step 402.

At etching step 402, channels are etched into the oxide layer surrounding the source line. The channels are etched to a selected depth such that the source line is exposed in the channels that were formed above the source line. After etching step 402 is completed, the method continues to depositing step 404.

At depositing step 404, amorphous silicon is deposited into the channels. In one embodiment, depositing step 404 is followed by polishing step 405. At polishing step 405 the amorphous silicon is polished until it is flush with the oxide layer. After polishing step 405 is completed, the method continues to re-crystallization step 406.

At re-crystallization step 406, the amorphous silicon volume shrinks in the channels by re-crystallization. Re-crystallization can be applied to create single-crystal silicon or polycrystalline silicon. In one embodiment, re-crystallization step 406 is a low temperature process. The low temperature process may be, for example, laser-based re-crystallization. After re-crystallization step 406 is completed, the method continues to polishing step 408.

At polishing step 408, the oxide layer surrounding the source line is polished until it is flush with the amorphous silicon. After polishing step 408 is completed, the method continues to etching step 410.

At etching step 410, the oxide layer is etched to the selected depth achieved in etching step 402.

Figure 5:
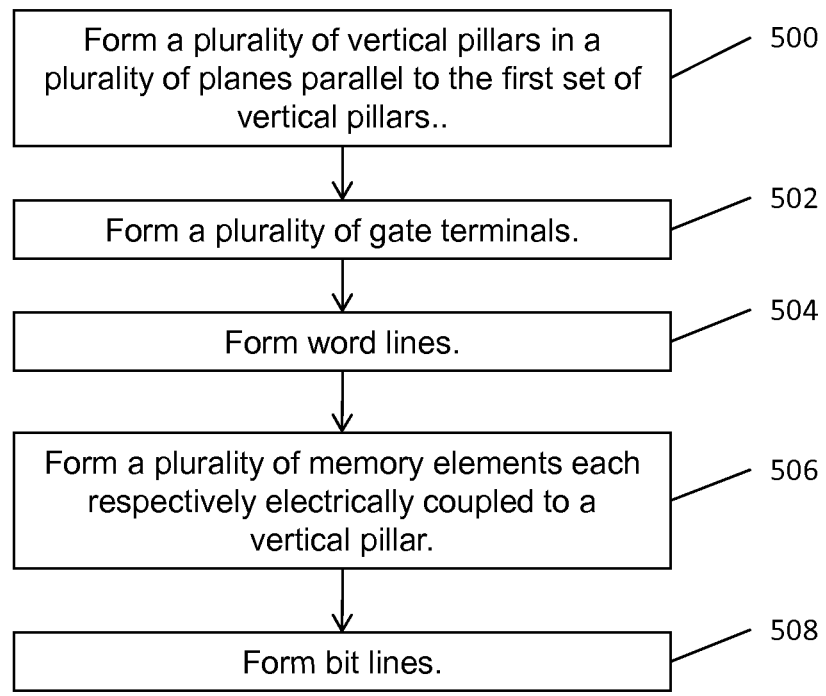
FIG. 5 shows a method for forming additional word lines parallel to the first word line in accordance with one embodiment of the present invention.

FIG. 5 shows a method for forming additional word lines parallel to the first word line in accordance with one embodiment of the present invention. The method includes vertical pillar forming step 500. During vertical pillar forming step 500 a plurality of vertical pillars are formed in planes parallel to the first set of vertical pillars. At least two pillars in each of these additional planes are electrically isolated from the source line and at least one pillar is electrically coupled to the source line. After vertical pillar forming step 500 is completed, the method continues to gate terminals forming step 502.

At gate terminals forming step 502, a plurality of gate terminals are formed in each of the additional planes. These gate terminals laterally surround each of the vertical pillars in their respective plane. Furthermore, these gate terminals are electrically isolated from any of the gate terminals formed in the other planes. After gate terminals forming step 502 is completed, the method continues to word line depositing step 504.

At word line depositing step 504, at least one word line contact is deposited in each additional plane between two of the electrically isolated vertical pillars. Furthermore, each word line contact is electrically coupled to the gate terminals in its respective plane. After word line depositing step 504 is completed, the method continues to memory elements forming step 506.

At memory elements forming step 506, a plurality of memory elements are formed in each of the additional planes. Each of the electrically coupled vertical pillars in the additional planes is electrically coupled to one of these memory elements. After memory elements forming step 506 is completed, the method continues to bit line depositing step 508.

At bit line depositing step 508, bit line contacts are formed and electrically coupled to the memory elements in each of the additional planes.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory array for electrically coupling memory cell access devices to a word line, the memory array comprising:
    a source line electrically coupled to each source terminal of the memory cell access devices along a horizontal direction;
    a first set of at least two vertical pillars positioned above and electrically coupled to the source line;
    a second set of vertical pillars aligned with the first set of at least two vertical pillars along the horizontal direction of the source line, the second set of at least two vertical pillars electrically isolated from the source line and positioned such that the source line does not extend below the second set of vertical pillars;
    gate terminals of the memory cell access devices, the gate terminals laterally surrounding the first set of vertical pillars and the second set of vertical pillars; and
    a first word line contact positioned between two of the second set of vertical pillars and electrically coupled to the gate terminals.

2. The memory array of claim 1, further comprising a plurality of memory elements respectively electrically coupled to each of the first set of vertical pillars.

3. The memory array of claim 1, further comprising a second word line contact positioned between two of the second set of vertical pillars and electrically coupled to the gate terminals.

4. The memory array of claim 1, further comprising a source line contact electrically coupled to the source line.

5. The memory array of claim 2, further comprising a plurality of bit line contacts, each bit line contact from the plurality of bit line contacts electrically coupled to a respective memory element from the memory elements.

6. The memory array of claim 2, further comprising:
    wherein each of the first set of vertical pillars include a first end and a second end, the first end is electrically coupled to the source line and the second end is electrically coupled to one of the plurality of memory elements.

7. The memory array of claim 2, wherein the memory elements are selected from the group consisting of resistive RAM (RRAM), magnetoresistive RAM (MRAM), spin-transfer torque RAM (STT-RAM), and phase-change memory (PCM).

8. The memory array of claim 2, further comprising an oxide layer surrounding the first set of vertical pillars and the second set of vertical pillars, the oxide layer positioned between the first set of vertical pillars and the gate terminals and the second set of vertical pillars and the gate terminals.

* * * * *